United States Patent [19]

Reeder et al.

[11] 4,016,514
[45] Apr. 5, 1977

[54] DIODE COUPLED TAPPED ACOUSTIC DELAY LINE CORRELATOR AND CONVOLVER

[75] Inventors: Thomas M. Reeder, Glastonbury; Meyer Gilden, West Hartford, both of Conn.

[73] Assignee: United Technologies Corporation, Hartford, Conn.

[22] Filed: Oct. 9, 1973

[21] Appl. No.: 404,831

[52] U.S. Cl. .............................. 333/30 R; 235/181; 310/9.8; 333/72

[51] Int. Cl.$^2$ ..................... H03H 9/26; H03H 9/30; G06G 7/19; H01L 9/04

[58] Field of Search ..................... 333/30 R, 20, 72; 235/181; 310/8.1, 9.8; 324/77 H

[56] References Cited

UNITED STATES PATENTS 3,691,406  9/1972  Mize ......................... 317/235 G X

OTHER PUBLICATIONS

Luukkala et al. – "Convolution and Time Inversion Using Parametric Interactions of Acoustic Surface Waves," in Applied Physics Letters, vol. 18, No. 9, May 1, 1971, pp. 393–394.

Primary Examiner—Alfred E. Smith
Assistant Examiner—Marvin Nussbaum
Attorney, Agent, or Firm—Donald F. Bradley

[57] ABSTRACT

A nonlinear delay line correlator and convolver is described which comprises a tapped, piezoelectric surface acoustic wave delay line and an array of series or parallel connected forward biased semiconductor diodes. An interdigital signal transducer is connected to each end of the delay line and voltages are applied to each transducer to generate contra-flowing acoustic strain waves which are radiated toward an interaction region comprising a plurality of equi-spaced weakly coupled interdigital transducers, each transducer being connected to one diode. Nonlinear signal mixing in the diode array is utilized to perform serial product convolution or correlation of the signal modulation applied at the two signal input transducers. Because of the large nonlinearity of semiconductor diodes, insertion loss is relatively low. One feature of the diode correlator is a novel dual acoustic beam transducer which permits two separate acoustic beams to be generated without interaction therebetween except at the transducer taps.

19 Claims, 8 Drawing Figures

DIODE COUPLED TAPPED ACOUSTIC DELAY LINE CORRELATOR AND CONVOLVER

BACKGROUND OF THE INVENTION

1. Field of the Invention

This invention relates to a three port signal processor capable of real time, wide bandwidth signal convolution and correlation at VHF and lower microwave frequencies. More specifically, this invention relates to a tapped, piezoelectric surface acoustic wave delay line having two ports comprising an interdigital transducer at each end of the delay line separated by an interaction region composed of equi-spaced transducers, each connected to a forward biased semiconductor diode. Nonlinear signal mixing occurs in the diodes, and the signals from the diodes are summed at a third port.

2. Description of the Prior Art

Real time signal correlation and convolution by use of nonlinear wave interaction in VHF and microwave delay lnes is known in the prior art. A nonlinear acoustic wave correlator using nonlinear strain wave propagation in piezoelectric crystals is described in a paper entitled "Convolution and Correlation in Real Time with Nonlinear Acoustics" by C. F. Quate and R. B. Thompson in Applied Physics Letters, No. 16, pp. 494–496 (June 15, 1970). The nonlinearities employed by other investigators include electron-phonon interaction in piezoelectric semiconductor configuration, and magneto-static wave interaction in yttrium-iron-garnet.

Prior art devices as described above, and more specifically the separated medium, semiconductor layer devices, suffer from mechanical fragility, lack of semiconductor uniformity, and high insertion losses.

The nonlinear wave diode correlator described herein overcomes the disadvantages of the prior art devices. By performing signal mixing in a plurality of series or parallel semiconductor diodes located adjacent to the wave interaction region of a piezoelectric, surface acoustic wave delay line, the diode correlator of this invention can perform several different signal processing functions depending on which ports are used for input and output. Insertion loss is considerably reduced from prior art devices. The present diode correlator is a rugged, reliable, completely solid state device with excellent dynamic range characteristics which can be fabricated by standard intergrated circuit technology. Compared with the prior art, it exhibits very long interaction regions and very wide bandwidth. Because the present diode correlator operates with signal inputs of arbitrary amplitude and phase, it performs signal correlation with electronic adaptability. It may be used in radar and communications systems to perform large time-bandwidth pulse compression, electronically variable signal delay, and real time Fourier transformation.

SUMMARY OF THE INVENTION

In accordance with the present invention, the diode correlator comprises a delay line consisting of a piezoelectric material such as lithium niobate in the shape of a flat bar. At each end of the bar on the same side thereof, there is fabricated an interdigital transducer which acts as an input or output port (ports 1 and 2). In response to the application of voltage signals to the ports 1 and 2, contra-flowing acoustic strain waves are radiated toward an interaction region at the center of the delay line. A plurality of parallel interdigital transducers are formed on the surface of the delay line in the interaction region. To a tap associated with each transducer in the interaction region there is connected a semiconductor diode which is forward biased by an external voltage supply. The presence of the two contraflowing strain waves at each transducer in the interaction region sets up a voltage or current change at its associated diode at the sum or difference frequencies of the acoustic strain waves which is proportional to the product of the tap voltages. With proper choice of the input frequencies, the sum of the product signals from the diodes has a modulation which is proportional to the convolution of the two applied voltage signals. The convolution signal is sensed at a port 3.

Correlation of two signal waveforms may be accomplished by applying modulated carriers to ports 1 and 3. Waveform time reversal, real time Fourier transformation and pulse compression of chirp signals may also be performed in the present diode correlator.

As an additional feature of the present invention, a novel dual acoustic beam transducer is used in conjunction with the delay line which allows separate contra-flowing acoustic beams to be excited and to propagate independently along the delay line, the two beams interacting only at the transducers in the interaction region.

Other features and advantages of the present invention will be apparent to those skilled in the art in light of the following description of a preferred embodiment of this invention.

DESCRIPTION OF THE PREFERRED EMBODIMENT

Figure 1:
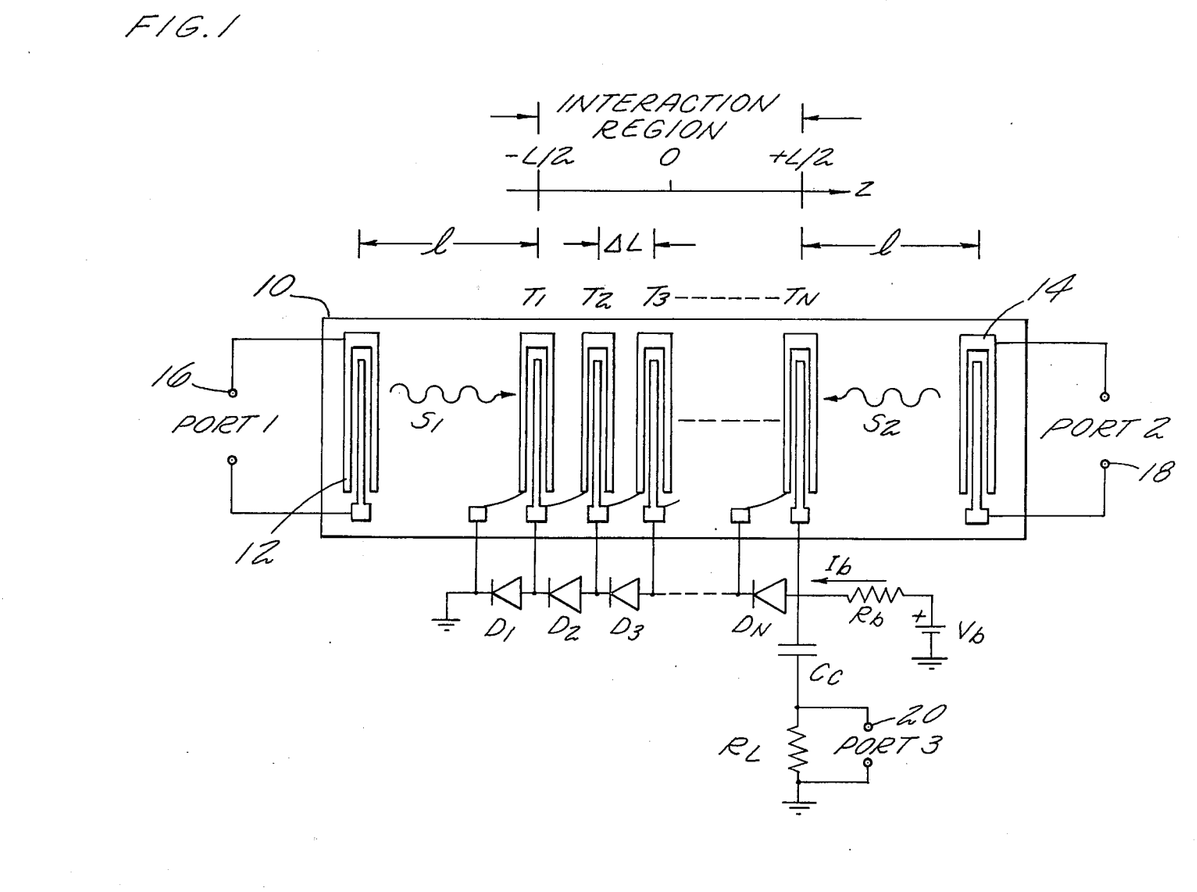
FIG. 1 is a schematic view of the WI diode correlator employing series diodes.
Figure 2:
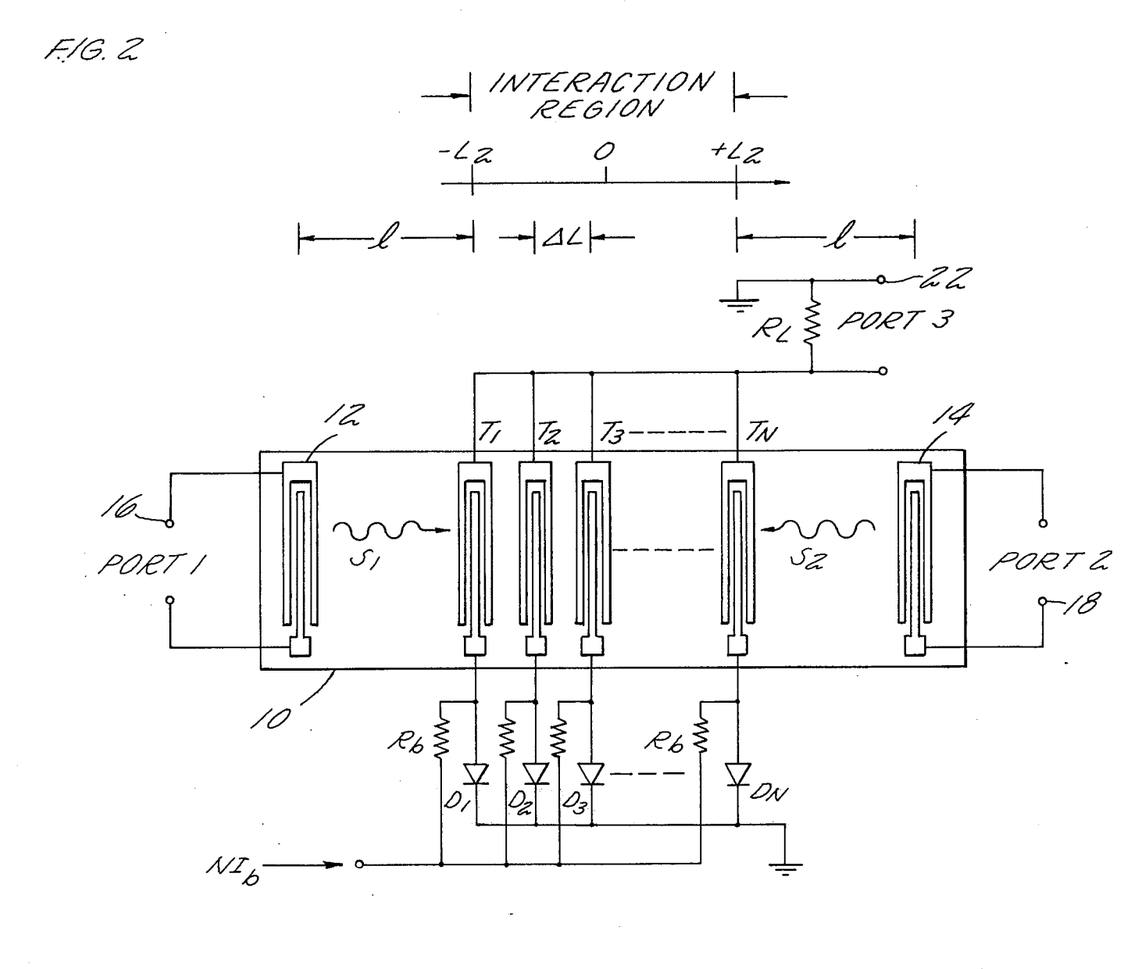
FIG. 2 is a schematic view of the diode correlator employing parallel diodes.

Referring specifically to FIGS. 1 and 2, there is shown schematically two distinct embodiments of the diode coupled, tapped delay line of the present invention. The delay line and its associated transducers are identical in both figures, the difference in the figures being the use of a series diode configuration in FIG. 1 and a parallel diode configuration in FIG. 2.

The delay line consists of a high quality piezoelectric substrate 10, usually lithium niobate, on which is mounted a plurality of transducers. While the transducers will be described as interdigital transducers, it is apparent that equivalent transducers may be substituted therefor. At opposite ends of the substrate 10 are mounted or deposited signal transducers 12 and 14.

The transducers are normally composed of metal deposited on the piezoelectric substrate 10 in the form of a multi-finger pattern as shown. Although the patterns shown have only three fingers, the transducer patterns may in general have more or less fingers to enhance certain operational embodiments. The fingers are alternately connected to the terminals of the signal transducer. As shown in the figures, a terminal 16 is connected with signal transducer 12, and a terminal 18 is connected with signal transducer 14. The transducer 12 and its associated terminals 16 will be referred to as port 1, and transducer 14 and its associated terminals 18 will be referred to as port 2.

The type of transducer represented in the figures as 12 and 14 is referred to as an interdigital transducer because of the finger-like pattern. An incoming electric signal will set up a time varying electric field pattern between the fingers of the transducer. Because of the properties of piezoelectric materials, this time varying field will couple into the substrate as a material or acoustic wave. The particle motion is confined to within one wavelength of the surface and a surface acoustic wave travels outward in both normal directions to the transducer. Since the only wave of interest is the one which travels between the transducers 12 and 14, acoustic absorbing material may be used to absorb the unwanted wave. The center frequency at which the transducer is to operate generally determines the width of the finger and the spacing between fingers. The desired insertion loss and bandwidth determine the number of fingers.

Surface acoustic waves possess desirable characteristics for signal processing. Since acoustic surface wave materials are usually nondispersive, the surface wave is an exact amplitude and phase replica of the electrical input signal. In addition, since the wave travels on the surface of the piezoelectric substrate, additional transducers may be placed along the path to sample or probe the wave without causing significant disturbance to the propagating wave. Furthermore, since acoustic surface wave velocities are approximately 5 orders of magnitude smaller than the velocity of light, the wavelength of an acoustic surface wave is 5 orders of magnitude smaller than an electromagnetic wave of the same frequency, permitting signal interaction such as correlation and convolution with physically small acoustic surface wave devices.

In order to sense the acoustic waves propagating along the surface of the piezoelectric substrate, a plurality of N equi-spaced weakly coupled interdigital transducers identified as $T_1, T_2, T_3, \ldots T_N$ are deposited on the substrate 10. The interaction region of the delay line is the region on which the transducers $T_1 \ldots T_N$ are mounted and is identified as having a lenght L. The distance from each siganl transducer 12 or 14 to the interaction region is shown as distance $l$.

Each of the transducers $T_1 \ldots T_N$ has connected thereto a semiconductor diode shown as $D_1, D_2, D_3 \ldots D_N$. In FIG. 1, the diodes $D_1 \ldots D_N$ are connected in series and a current $I_b$ is supplied by a voltage source $V_b$ through a load resistor $R_b$ in order to forward bias each of the diodes. As shown in FIG. 1, each diode is in effect connected across two fingers of each transducer, and the center finger of each transducer is connected to the adjacent outer finger of the next transducer. Both the cathode of diode $D_1$ and the outer finger of transducer $T_1$ are grounded, while the anode junction of diode $D_N$ and the center finger of transducer $T_N$ are connected to a load $R_L$ through a capacitor $C_c$. Connected across the load $R_L$ is an output terminal 20, the load and the terminal being referred to hereinafter as port 3.

As opposed to the series diode configuration of FIG. 1, each diode $D_1 \ldots D_N$ of FIG. 2 is connected in series between the center finger of its associated transducer $T_1$ through $T_N$ with the cathode of each diode being grounded. A current $I_b$ is provided to the anode junction of each diode through a resistor $R_b$. The outermost fingers of each transducer are joined to one side of a load resistor $R_L$, the other end of the load resistor being grounded. A terminal 22 is connected across load resistor $R_L$, and the load with its associated terminal will be referred to as port 3.

The diode correlators of FIGS. 1 and 2 operate in a similar manner and will perform numerous signal processing functions. The convolution of two arbitrary voltage waveforms, $V_1(t)$ and $V_2(t)$, is obtained by applying signals of the form $V_1(t)\exp(j\omega_1 t)$ and $V_2(t)\exp(j\omega_2 t)$, to the interdigital transducers at ports 1 and 2, respectively. The signals introduced at ports 1 and 2 produce acoustic waves which flow in opposite directions through the interaction region defined by the array of N transducers. The acousitc waves are shown in FIGS. 1 and 2 as $S_1$ and $S_2$. The spatial extent of these waves mirrors their electrical input waveform in both amplitude and phase. If the waves are weakly sampled by nonlinear devices distributed uniformly over the interaction region, data may be obtained representing the spatial product of the two input waveforms without appreciably disturbing the propagation of the waves through the interaction region. The sum or integral of these spatial product terms is proportional to the convolution of the two signal waveforms introduced at ports 1 and 2.

As the acoustic waves $S_1$ and $S_2$ propagate accross the interaction region, a voltage is set up as the wave crosses the transducers $T_1$ through $T_N$, and this voltage is conducted to the respective diodes $D_1$ through $D_N$ connected with each transducer as shown in FIGS. 1 and 2. Due to the nonlinearity of the diodes, the presence of the acoustic waves $S_1$ and $S_2$ at a given transducer gives rise to a voltage or current at the sum or difference frequency, $f_3 = \omega_3/2\pi = |f_1 \pm f_2|$, which for small signal diode conditions is proportional to the product of the voltages excited in the transducers by waves $S_1$ and $S_2$ at frequencies $f_1$ and $f_2$, respectively. The product voltages or currents which appear at each of the diodes are summed and appear across the resistor $R_L$ in each of the FIGS. 1 and 2. If the frequencies $f_1$ and $f_2$ corresponding to the acoustic waves $S_1$ and $S_2$ are such that the product voltages at the transducers $T_1$ through $T_N$ are in phase when continuous wave signals are applied to ports 1 and 2, the sum of the product signals appearing across resistor $R_L$ obtained for arbitrary input signal modulation is found to have a modulation waveform, $V_3(t)$, which is proportional to the serial product form of convolution for $V_1(t)$ and $V_2(t)$. For example, if the port 3 output across resistor $R_L$ is centered at the sum frequency $f_3 = f_1 + f_2$, the transducer phase matching condition requires that $$|f_1-f_2| = n/\Delta t \qquad \text{Equation (1)}$$

where $\Delta T = \Delta L/V$ is the transit time between the transducers and n in an integer. Assuming that the bandwidth of each transducer is much larger than the frequency spectrum of the waveforms $V_1(t)$ and $V_2(t)$, the output waveforms at port 3 is given by $$V_3(t) = A \sum_{n=1}^{N} V_1(t_n) V_2 [2(t-t_d) - t_n] \qquad \text{Equation (2)}$$

where A is a constant, $t_d = (l + L/2)/v$ is the time delay between ports 1 and 2 and the center of the delay line interaction region, and $t_n = Z_n/V$ is the effective waveform sampling time for strain waves crossing the nth tap. Compared to the usual mathematical definition of serial product convolution, the output time scale in Equation (2) is compressed by a factor of two and is delayed by a time $t_d$. The similarity of Equation (2) with the integral form of convolution obtained with a continuous, nonlinear interaction region will be apparent to those skilled in the art. If the number of transducers is large and the input waveforms $S_1$ and $S_2$ vary slowly during the transit time $\Delta T$, the integral and serial forms of convolution become indistinguishable.

Due to the nonlinearity of the diodes, the current and voltage will, in general, contain frequency components derived from all possible harmonic and mixing combinations of the two input carrier frequencies, $f_1$ and $f_2$. In a practical case, however, the diodes are operated under small signal conditions and the only frequencies of interest are $f_1, f_2$ and $f_3 = |f_1 \pm f_2|$. Other measurable frequency components will be generated in the diode circuit, but these may be removed by band-pass filtering at the correlator port 3.

The diode nonlinearity is the source of the product term at the frequency $f_3$ which permits the convolution to be obtained in the diode correlator. The only restrictions on obtaining at port 3 the convolution of waveforms introduced at ports 1 and 2 are: first, the transducers must not extract appreciable wave power; and second, the input carrier frequencies are chosen such that the transducer outputs are phase matched at the frequency $f_3$. The first requirement is satisfied by state of the art transducer design. The transducer phase matching condition has been discussed previously.

Figure 3:
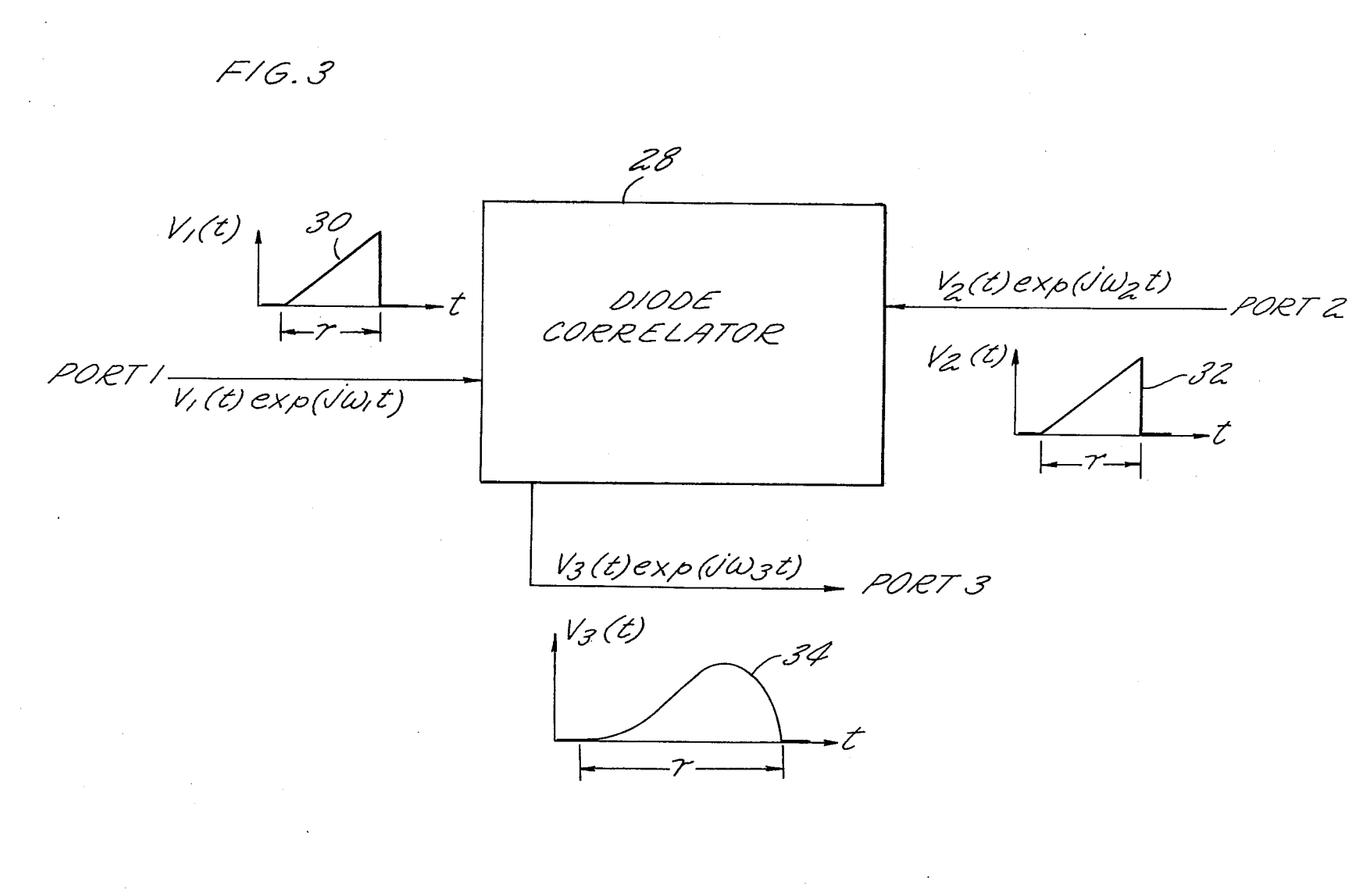
FIG. 3 shows in graphic form the convolution of two ramp input signals.

FIG. 3 shows the process of convolution for ramp waveform inputs with the relationship between input time coordinates in spatial waveform shape. Referring to FIG. 3, if signals having a modulation waveform shown at 30 and 32 are introduced respectively into ports 1 and 2 of diode correlator 28, the convolution waveform shown at 34 will be produced at port 3. The waveform 32 introduced at port 2 is identical to the waveform 30 introduced at port 1.

Figure 4:
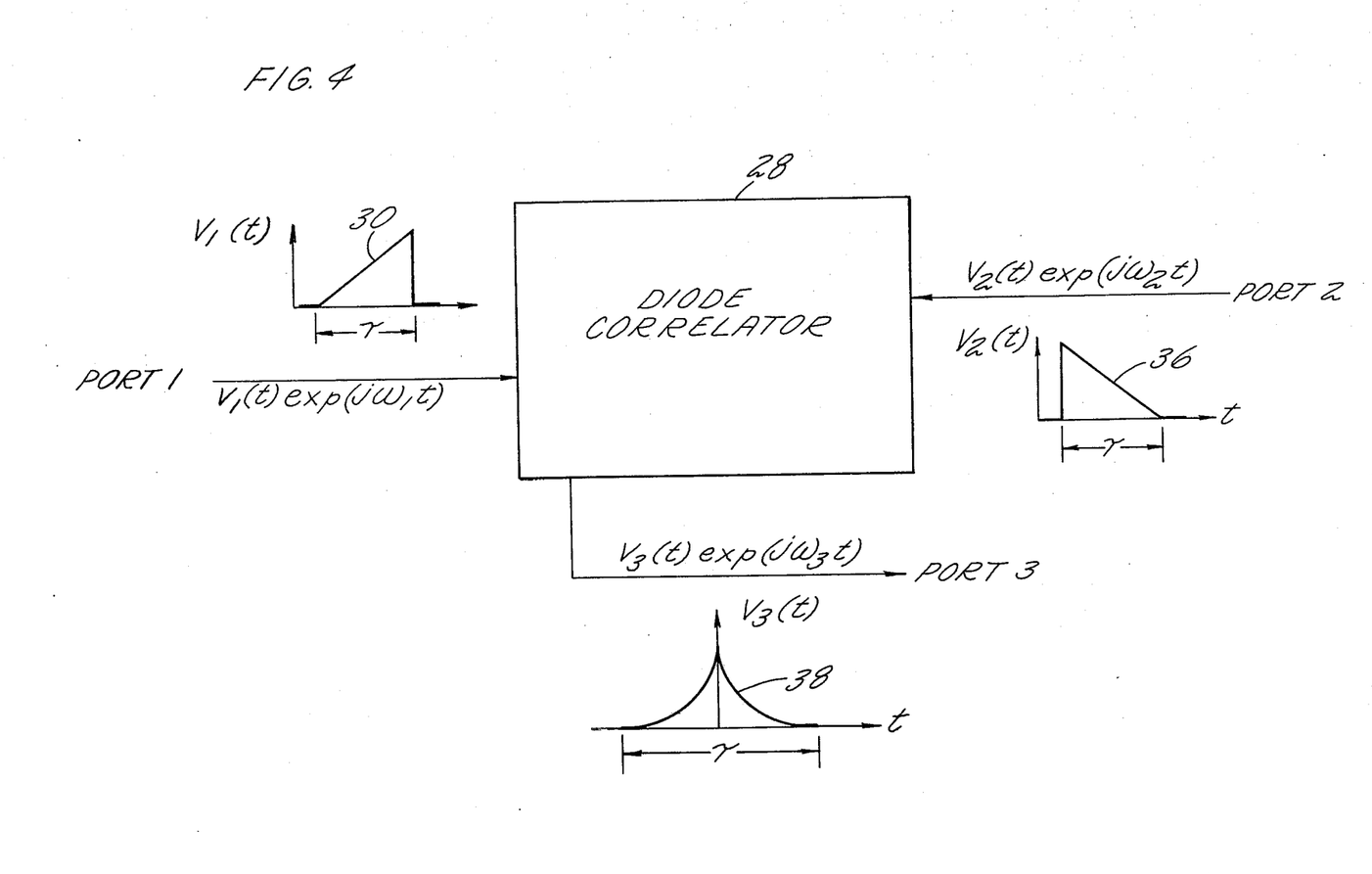
FIG. 4 shows in graphic form the correlation of two ramp input signals.

FIG. 4 shows one way that the diode correlator can be used in true correlation. The waveform 30 introduced at port 1 of the diode correlator 28 is time inverted before application at port 2 as shown by waveform 36. The correlation output from port 3 is shown by waveform 38.

Rather than apply the modulation waveforms to ports 1 and 2 as shown in FIG. 4, the correlation of two signal waveforms may be accomplished by applying modulated carriers of the form $V_1(t)\exp(j\omega_1 t)$ and $V_3(t)\exp(j\omega_3 t)$ to ports and 1 and 3 respectively. A new waveform with a carrier frequency $f_2 = |f_1 \pm f_3|$ will be created in the interaction region and will propagate symmetrically toward ports 1 and 2. If the carrier frequencies are again adjusted to satisfy Equation (1), the voltage waveform received at port 1 due to the sum of waves excited at all the transducers may be written $$V_2(t) = B \sum_{n=1}^{N} V_1 [2t_n - t] V_3(t_n) \qquad \text{Equation (3)}$$

where again $t_n = Z_n/V$ and B is a constant. Equation (3) is recognized as a type of the serial product form of correlation between waveforms $V_1(t)$ and $V_3(t)$. However, the time scale of $V_1(t)$ must be twice that of $V_3(t)$ in order to make Equation (3) fit the usual definition. If the transducer transit time is short enough, the integral form of correlation is produced.

Figure 5:
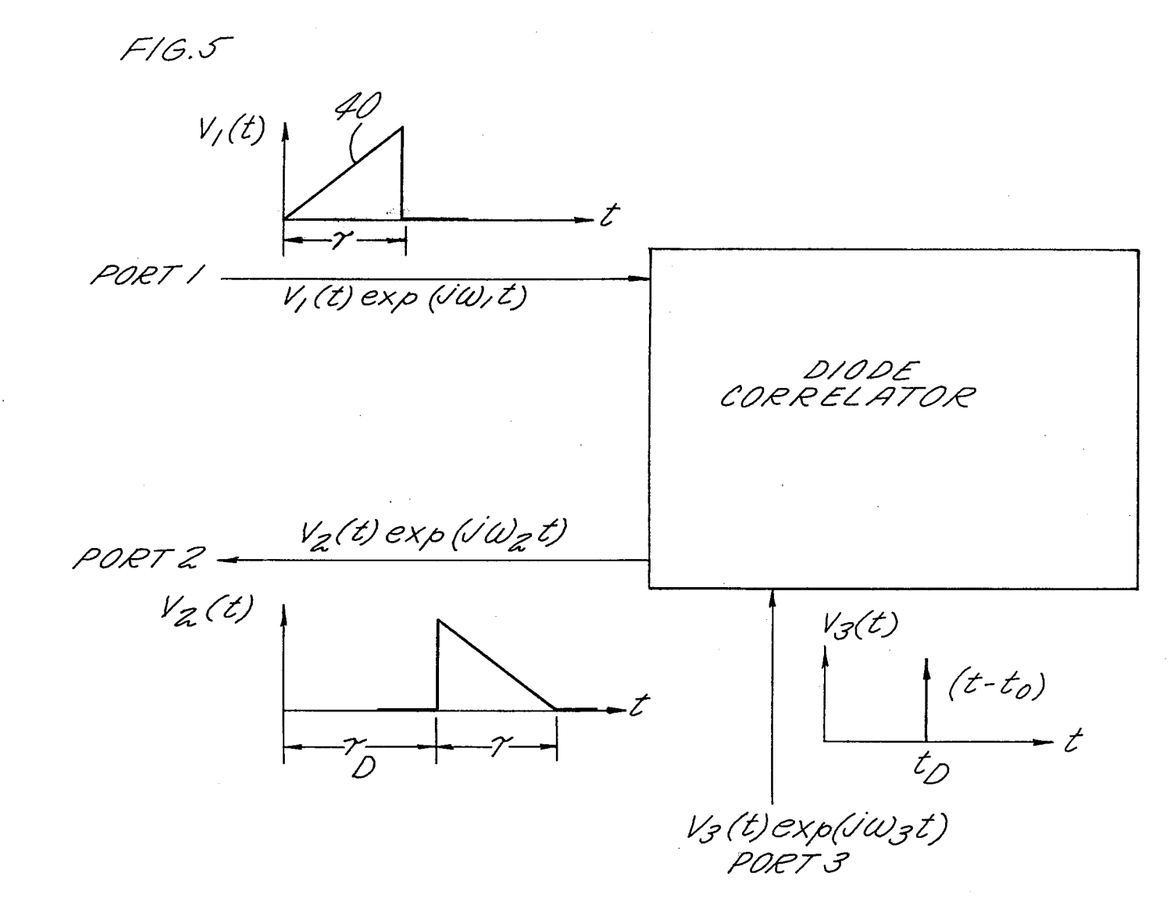
FIG. 5 shows in graphic form the use of the present invention to perform waveform reversal.

FIG. 5 shows the use of ports 1 and 3 of the diode correlator 28 as inputs in order to perform waveform time reversal. The input waveform 40 at port 1 is a ramp waveform, while the waveform 42 introduced at port 3 is a delta function. The otput waveform 44 from port 2 is identical to the ramp input waveform 40 except that it is time reversed. An electronically variable delay equal to the difference between the interaction region transit time and the input waveform duration is available. Time reversal as shown in FIG. 5 is important since this process is equivalent to electronic generation of the matched filter response for an arbitrary input function. Matched filter generation is of importance to radar pulse compression and other precision detection schemes.

One important application of the time reversal shown in FIG. 5 is in the correlation of arbitrary input signals such as might be obtained in radar systems. Two diode correlators and a storage delay line are required. The unknown signal, which must have a duration less than the correlator interaction region transit time is applied equally to the storage delay line and the time reversal correlator. The stored signal has a carrier frequency $f_1$ while the time reversed image has a frequency $f_2$. These two signals are subsequently applied to the second correlator where true correlation is carried out.

Figure 6:
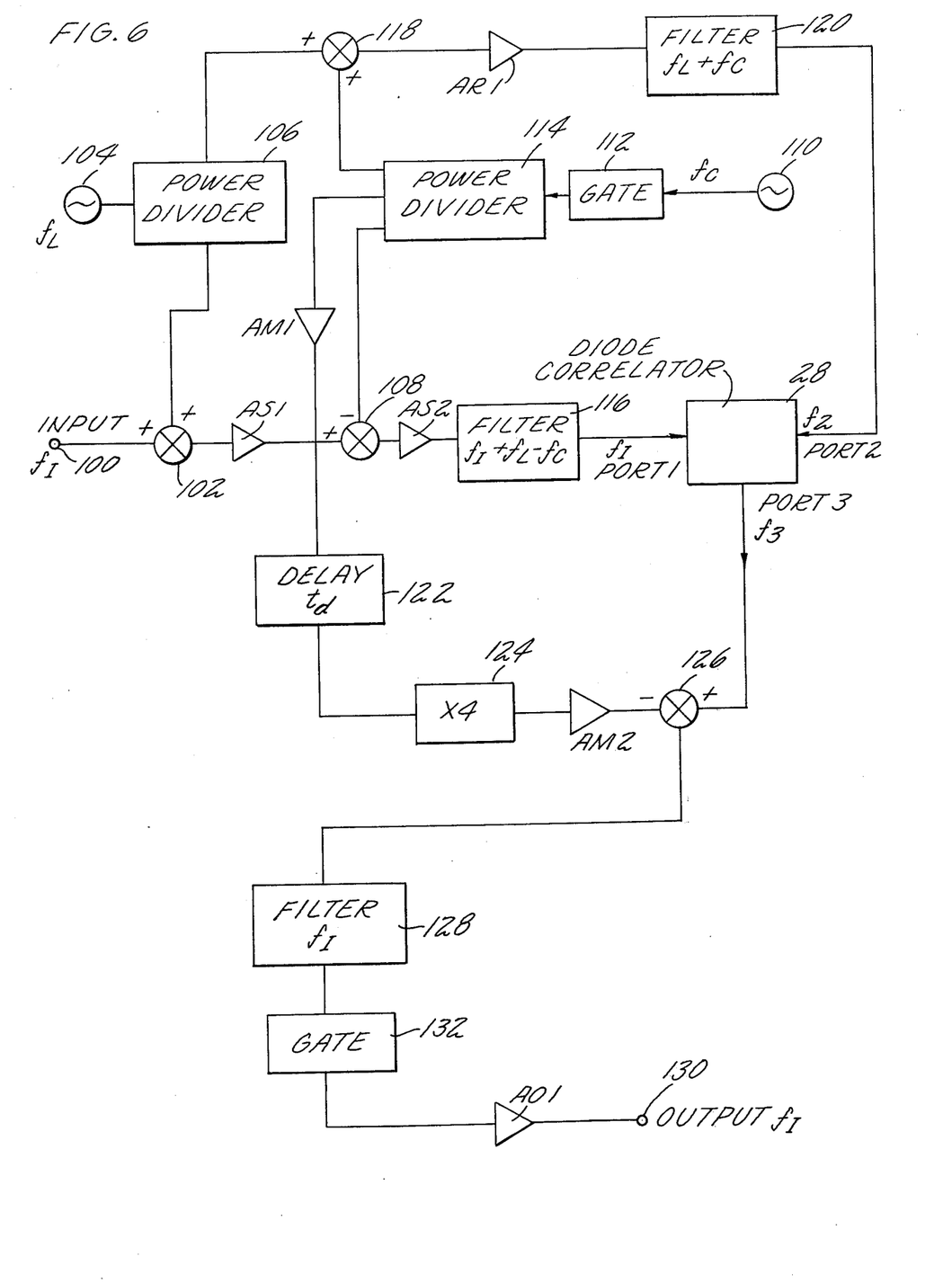
FIG. 6 shows in schematic form a system using the diode correlator to perform real time Fourier transform.

FIG. 6 shows how real time Fourier transformation can be carried out with the diode correlator 28. Briefly, the Fourier transform is carried out by first multiplying the input waveform $g(t)$ by an FM chirp signal, performing the convolution of the result with time shifting chirp signal of opposite slope, and finally subtracting a harmonic of the reference chirp signal to remove unwanted phase variations. If the reference chirp signal has the form $\exp(j2\pi f_c t + j \Delta t^2)$ where $f_c$ is the chirp center frequency and $\Delta$ is the chirp frequency slope parameter, the modulation output of the circuit in FIG. 6 has the integral form $$V_2(t) = A \int_{t-t_d-\frac{T_l}{2}}^{t-t_d+\frac{T_l}{2}} g(x) e^{-j4\Delta(t-t_d)x} dx \qquad \text{Equation (4).}$$

As before, $t_d$ is the time delay for acoustic waves traveling to the center of the diode-correlator interaction region and $T_l$ is the transit time length of the interaction region. The output described by Equation (4) is seen to be equal to the Fourier transform of input modulation $g(t)$ provided that the reference chirp and diode-correlator interaction length are properly chosen so that the reference chirp and input modulation are fully contained inside the interaction region at all times of Fourier transform output. In a practical case this is done by limiting the duration of $g(t)$ to one-half $T_I$ or less and setting the chirp slope parameter $\Delta = 2\pi B/T_I$ where B is the chirp bandwidth swept out over time $T_I/2$. The expected Fourier transform of modulation $g(t)$ over the frequency range $-B<f<B$ is then received at the output terminal of FIG. 6 over the output time interval $-T_I/4 < t-t_d < T_I/4$. Since undesired spurious signals can be received at other times, solid state switches or gates are included in FIG. 6 to limit the circuit operation to the desired time interval.

Referring specifically to FIG. 6 there is shown in block diagram form a preferred Fourier transform subsystem using the diode correlator of FIGS. 1 or 2. A video waveform, $g(t)$, is applied to the input 100 as a modulated carrier, $g(t)$ exp $(j\omega_I t)$, where $f_I=\omega_I/2\pi$ may be any convenient frequency in the VHF frequency range. The input signal, $f_I$, is mixed in mixer 102 with a signal of frequency $f_L$ to give flexibilitly in the choice of carrier frequencies applied to the diode correlator 28. The signal of frequency $f_L$ is generated by a local oscillator 104 and is passed through a power divider 106. The signal from mixer 102 which is the sum frequency $f_I + f_L$ is in turn mixed with a reference chirp signal centered at a frequency $f_C$ in a mixer 108 in order to provide the chirp modulation required at port 1 of the diode correlator 28. The reference chirp signal $f_C$ is generated in a local oscillator 110 in response to a chirp trigger signal, not shown, and which is passed through a gate 112 which is a solid state switch used to shape the amplitude output of the chirp generator. The output from gate 112 is passed to a power divider 114 from which the reference chirp signal $f_C$ is fed to mixer 108.

The output from mixer 108 at the difference frequency $f_1 = f_I + f_L - f_C$ is passed through a bandpass filter 116 and fed to port 1 of diode correlator 28. Thus, if the reference chirp generator 110 has the relative phase generation exp $(j\Delta t^2)$, the chirp modulation at port 1 varies as exp $(-j\Delta t^2)$. Amplifiers AS1 an AS2 are included to account for mixer and filter loss and to provide the desired power input level at port 1 of diode correlator 28.

The chirp signal applied at port 2 of diode correlator 28 is obtained by mixing the reference chirp signal $f_C$ from oscillator 110 with the local oscillator signal $f_L$ in mixer 118 to obtain a chirp with center frequency $f_2 = f_I + f_C$. The relative phase variation of this signal is exp $(j\Delta t^2)$. Amplifier AR1 is used to boost the power level at port 2 of diode correlator 28. A bandpass filter 120 is also used in the port 2 signal path.

The sum frequency signal $f_3$ at port 3 of diode correlator 28 is the product of a chirp signal that varies as exp $(j4 \Delta [t-t_d]^2)$ and the desired Fourier transform signal, both being delayed by the time $t_d$ required for signals to pass through diode correlator 28. As shown by the above, the phase variation at unwanted product chirp signals varies four times faster than the reference chirp phase, the factor of four arising from the contraflowing of waves in the diode correlator 28.

The port 3 variation may be concelled out by delaying a sample of the reference chirp signal $f_C$ from power divider 114 for a time $t_d$ in block 122, multiplying by four in block 124, and subtracting this fourth harmonic from the diode correlator port 3 output in mixer 126. Further, if the chirp and local oscillator center frequencies are properly chosen, the subsystem output carrier frequency can be made the same as the input. A bandpass filter 128 of frequency $f_I$ and an ammplifier A01 are used at the output 130 to select the proper mixer output and to restore the signal to a desired level. Gate 132 gated by an appropriate tuning signal, not shown, selects the time interval for proper Fourier transform output. Auxiliary circuits required to time reference the chirp and gate circuits are not shown.

Figure 7:
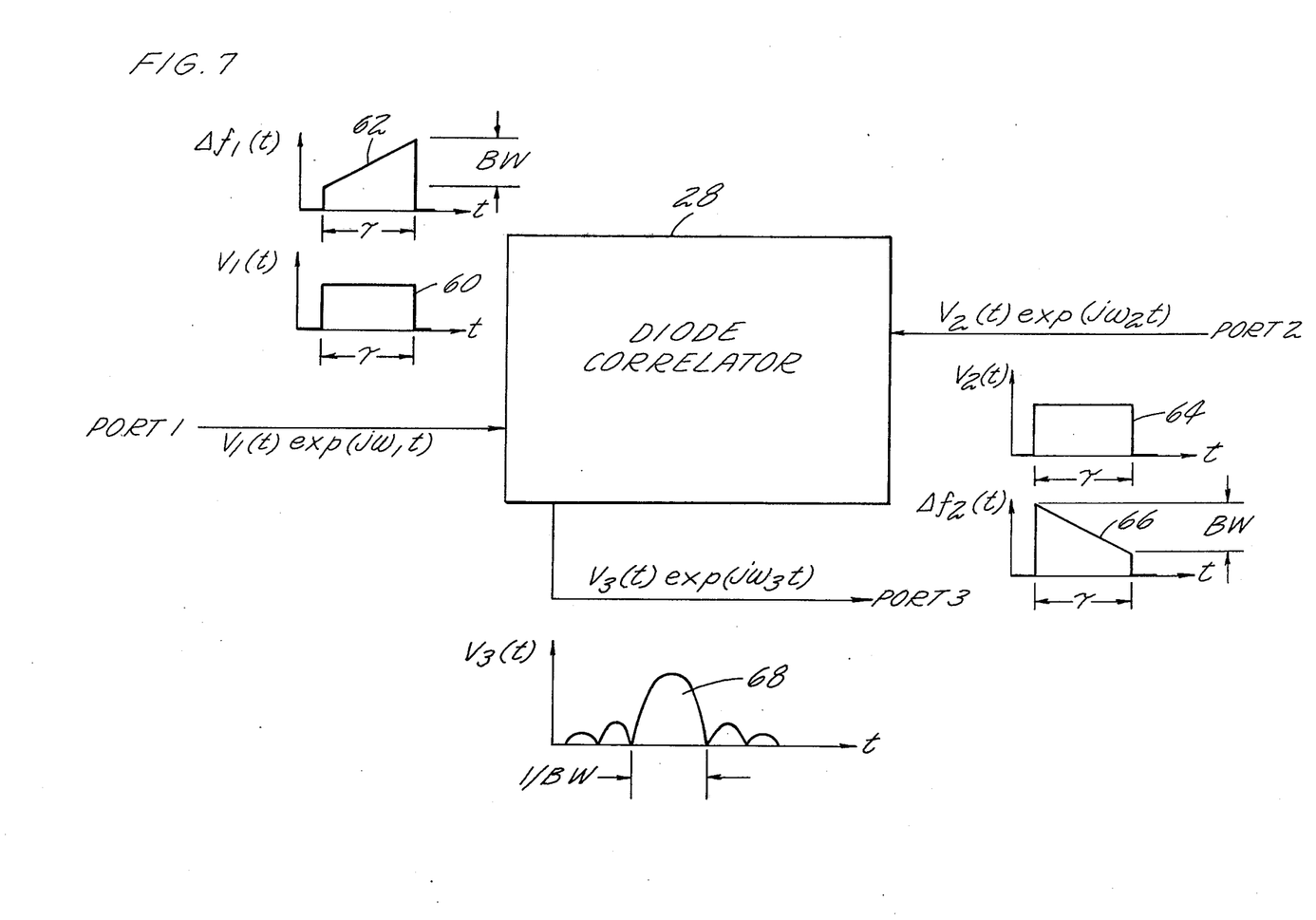
FIG. 7 shows in graphic form the use of the present invention to perform pulse compression of chirp signals.

FIG. 7 shows an important use of the diode correlator 28 in radar systems, the pulse compression of chirp signals. As before, auto-correlation is accomplished by applying the original and time reversed chirp signals to ports 1 and 2 of the correlator. Modulation waveform 60 and 64 show the shape of the input signals applied to ports 1 and 2 respectively, while waveforms 62 and 66 show that the frequencies of the modulation waveforms at ports 1 and 2 are varying in opposite directions, that is, the frequency chirp is time reversed at port 2 with respect to port 1. The output from port 3 is shown as modulation waveform 68. The frequency law $f_3 = f_1 + f_2$ is satisfied at all times within the diode-correlator interaction region. The correlated output 68 has the classical "sin x/x" time envelope within the limitations imposed by the tapped interaction region. The maximum time compression is equal to twice the time-bandwidth product of the correlator interaction region. Since time delays on the order of 10 microseconds are easily achieved with transducer bandwidths of 100 Mhz, the maximum compression ratios are on the order of 2000.

Figure 8:
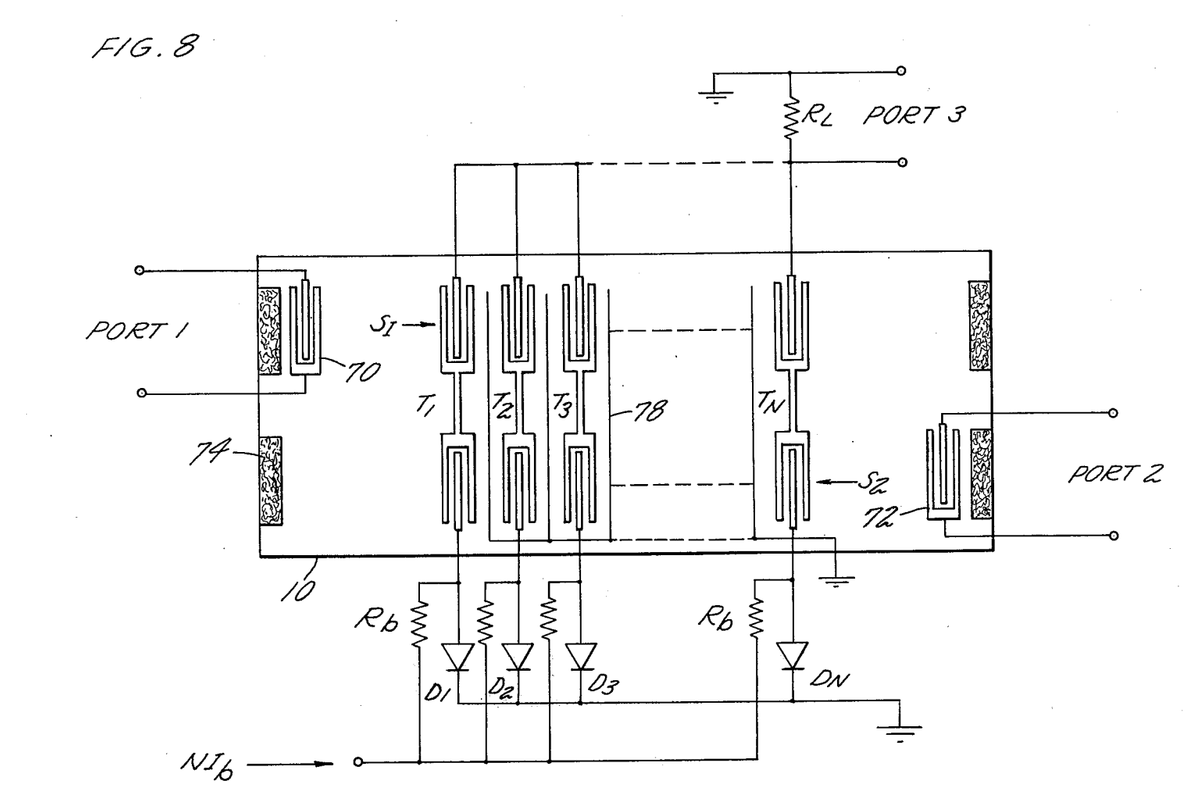
FIG. 8 shows schematically a novel dual acoustic beam transducer which may be used with the present invention.

FIG. 8 show a diode correlator construction having dual acoustic beam transducers 70 and 72 which permit separate acoustic beams to be excited and optimized for the input and reference signal frequencies $f_1$ and $f_2$. With the dual beam arrangement, only one low conversion loss signal transducer is required for each acoustic beam. Acoustic absorbing material placed at the end of each acoustic beam shown as 74 eliminates acoustic reflection signals. Also grounded fill-in electrodes 78 are used between the transducers in order to create an acoustic periodic structure with a periodicity sufficiently fine to be above cutoff. The use of these fill-in electrodes eliminates the possibility of reflections between tops and the structure can be designed in such a way as to cause very small attenuation of the propagating acoustic waves. Consequently, the problem of unwanted spurious correlation peaks arising from round trip acoustic reflections is virtually eliminated. The external circuitry of FIG. 8 is similar to that shown in FIG. 2.

The diodes shown in FIGS. 1 and 2 are preferably operated in forward bias which allows the diode impedance and nonlinear coupling to be conveniently optimized by adjustment of the diode current $I_b$. Diode-correlator operation can also successfully employ reverse biased diodes, but minimum insertion loss has generally been found lower with forward biased operation.

The diodes may be fabricated using microelectronic techniques. In an experimental arrangement using a silicon on sapphire substrate, a diode array having nine rows of 300 diodes each with 0.005 inch diode spacing has been achieved.

Several diode-correlators have been constructed with interaction regions comprising from 8 to 24 taps and input frequencies ranging from 30 to 210 Mhz. Both the series and parallel configurations have been tested and the dual acoustic beam interaction region has been utilized with both configurations. The lowest insertion loss (20db) was achieved with an 8 tap parallel configuration device operating with input frequencies at 28 and 30 Mhz and the output centered at 58 Mhz. The interaction region of this device was 8µS.

The diode correlator described herein has numerous advantages over similar prior art devices. The diode correlator is rugged in that hybrid integrated circuit fabrication techniques used in similar solid state devices may be used to produce the diode correlator. The present device has an extremely low loss, having demonstrated insertion losses below 30 db with large dynamic range. The diode correlator is broad band exhibiting 3 db bandwidths to 100 Mhz and higher. Long interaction lengths can be achieved with excellent suppression of spurious signals. The diode correlator has a large dynamic range well in excess of 60 db, and high reliability.

While the present invention has been described with respect to its preferred embodiment, it will be apparent to those skilled in the art that changes and modifications may be made to the construction and arrangement of parts and the operation thereof without departing from the scope of the invention as hereinafter claimed.

We claim.

1. An acoustic surface wave apparatus comprising
   a piezoelectric delay line having first and second signal transducers mounted thereon, said first and second transducers being separated by an interaction region having a plurality of equally spaced additional transducers mounted upon said delay line, each of said additional transducers having a tap connected thereto,
   a semiconductor diode connected to each said tap, means for supplying a bias current to each said diode,
   a load,
   and means connecting each of said diodes to said load.

2. Apparatus as in claim 1 in which said diodes are connected in series to form a diode chain, one end of said diode chain being connected to said load.

3. Apparatus as in claim 2 in which said additional transducers each comprise an interdigital transducer having an outer conductor and an inner conductor, each of said diodes being connected between the outer and inner conductors of its associated transducer.

4. Apparatus as in claim 3 in which the inner conductor of each of said interdigital transducers is connected to the outer conductor of the adjacent interdigital transducer.

5. Apparatus as in claim 1 in which each of said diodes is connected in series with its respective additional transducer with each series connected combination of transducer and diode being connected in parallel and one terminal of each of said diodes being connected to said load.

6. Apparatus as in claim 5 in which said additional transducers each comprise interdigital transducers having an outer conductor and an inner conductor, each of said diodes being connected in series with the inner conductor of its associated interdigital transducer, the outer conductors of each of said interdigital transducers being connected to said load.

7. Apparatus as in claim 1 and including filter means being connected between said diodes and said load.

8. Apparatus as in claim 1 and including first and second electrical terminals connected respectively to said first and second signal transducers.

9. Apparatus as in claim 8 and including a third electrical terminal connected with said load.

10. Apparatus as in claim 1 in which said means for supplying a bias current to said diodes includes means for forward biasing each said diode.

11. A method for processing two electrical signals comprising the steps of
    generating in a piezoelectric delay line first and second contra-flowing surface acoustic waves responsive respectively to first and second modulation waveforms,
    positioning in the path of both said acoustic waves a plurality of transducers, each said transducer producing a voltage in response to the coincidence of both said acoustic waves,
    applying each of said voltages to an independent nonlinear signal attenuation device connected with each of said transducers,
    and summing the outputs from each of said signal attenuation devices in a load.

12. A method as in claim 11 and including the steps of connecting each said signal attenuation device in series with its respective transducer,
    and connecting the outputs from each of said signal attenuation devices in parallel to said load.

13. A method as in claim 11 and including the step of connecting each said signal attenuation device in series.

14. A method as in claim 11 and including the step of biasing each said signal attenuation device.

15. A method as in claim 11 and including the step of filtering the outputs from said signal attenuation devices to pass to said load only desired frequencies.

16. An acoustic surface wave apparatus comprising
    a piezoelectric delay line having first and second transducers mounted thereon at opposite ends thereof,
    means connected with each of said transducers to generate an acoustic strain wave which propgates from each of said transducers to the opposite end of said delay line, said first and second transducers being positioned so that the strain wave generated by said first transducer does not overlap the strain wave generated by said second transducer,
    acoustic absorbing material positioned at the end of said delay line opposite each of said first and second transducers,
    a plurality of equally spaced additional transducers mounted on said delay line and positioned to intercept the acoustic strain waves generated by both of said first and second transducers,
    and nonlinear output means connected with each of said additional transducers.

17. An acoustic surface wave device as in claim 16 in which said output means includes a plurality of semiconductor diodes, one of said diodes being connected to each of said additional transducers,
    and a load means connected to all of said semiconductor diodes.

18. A method for processing two electrical signals comprising the steps of generating in different portions of a piezoelectric delay line first and second contra-flowing surface acoustic waves responsive respectively to first and second modulation waveforms, causing said first and second acoustic waves to propagate along different non-interacting paths, positioning in the path of both said acoustic waves a plurality of equi-spaced transducers, each said transducer producing a voltage in response to the coincidence of both said acoustic waves, and directing the voltage produced at each transducer to a nonlinear output means.

19. A method for generating a real time Fourier transform of an input electrical signal comprising the steps of multiplying the input signal by an FM chirp signal to produce a first chirp signal, generating a second chirp signal which is identical with said FM chirp signal but of opposite slope, directing said frist and second chirp signals as inputs to an electronically variable delay line, interacting said first and second chirp signals in said delay line to produce an output signal which is a convolution of said first and second chirp signals, and multiplying said output signal by a conjugate of a harmonic of said FM chirp signal.

* * * * *